Figure 1:
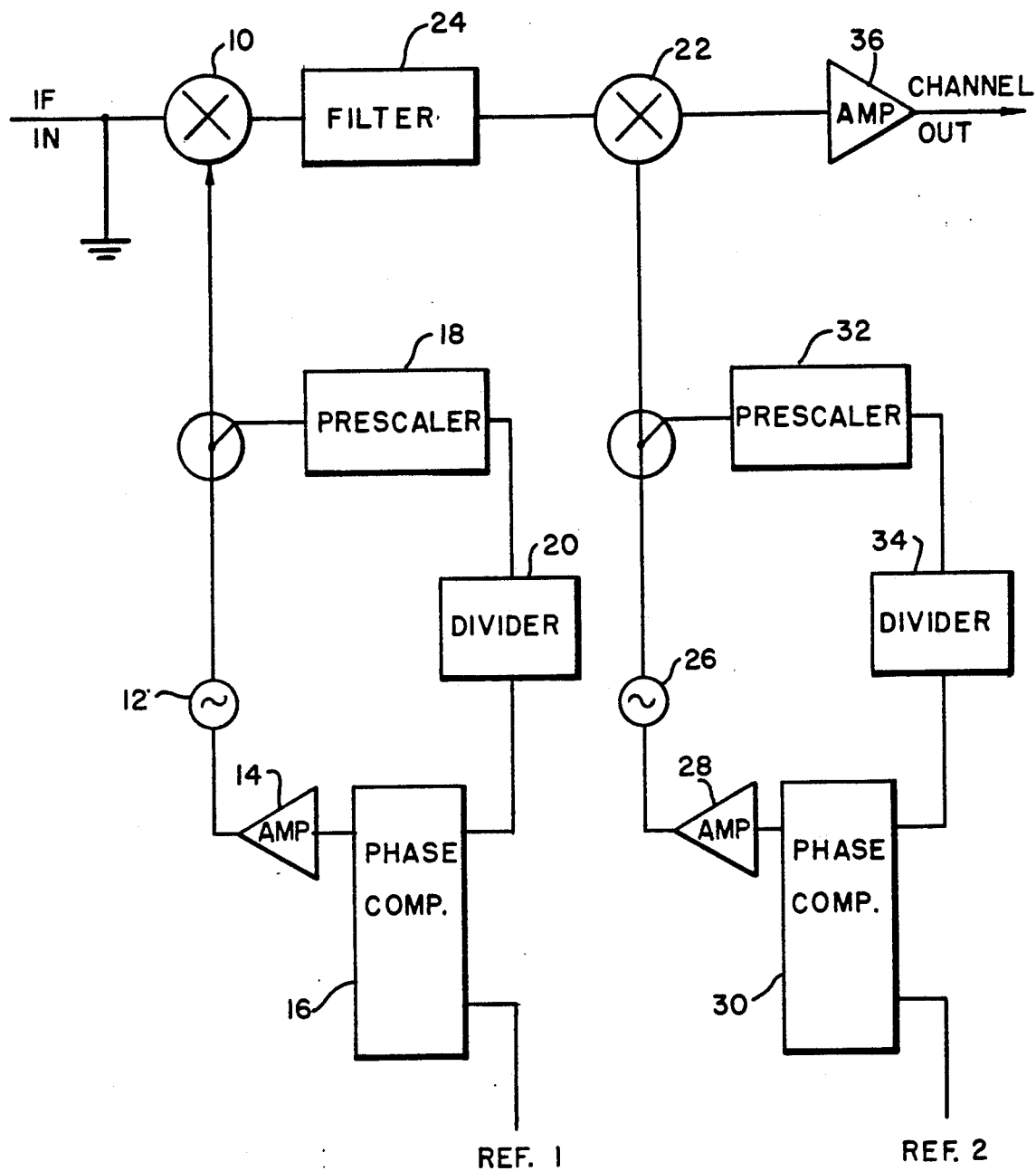

United States Patent [19]

Marz

[11] Patent Number: 5,038,404
[45] Date of Patent: Aug. 6, 1991

[54] LOW PHASE NOISE AGILE UP CONVERTER

[75] Inventor: Daniel Marz, Dresher, Pa.

[73] Assignee: General Instrument Corp.

[21] Appl. No.: 401,973

[22] Filed: Sep. 1, 1989

[51] Int. Cl.⁵ .............................................. H04B 1/04
[52] U.S. Cl. .................... 455/118; 358/186; 455/260; 455/265
[58] Field of Search ............... 455/118, 125, 185, 186, 455/260, 264, 265, 314, 315, 316, 3, 6, 103, 112, 313; 358/186, 191.1, 195.1; 332/123, 126, 127

[56] References Cited

U.S. PATENT DOCUMENTS

| | | | |
|---|---|---|---|
| 4,545,072 | 10/1985 | Skutta et al. | 455/183 |
| 4,551,856 | 11/1985 | Victor et al. | 455/183 |
| 4,575,761 | 3/1986 | Carlson et al. | 358/191.1 |
| 4,888,815 | 12/1989 | Ahlemeyer et al. | 455/168 |
| 4,918,403 | 4/1990 | Martin | 331/1 A |

Primary Examiner—Reinhard J. Eisenzopf
Assistant Examiner—Chi H. Pham
Attorney, Agent, or Firm—James & Franklin

[57] ABSTRACT

The converter has two mixer stages each including a phase locked loop with an oscillator controlled by a phase comparator. The frequency reference to both stages is provided by a single master reference. The frequency of the oscillator in the first stage is offset to accommodate the three different broadcast frequency conventions. A high frequency reference permits the second stage to compensate for noise kilohertz away from the carrier. A local oscillator output which is also phase locked to the master reference is provided for an external video modulator.

16 Claims, 3 Drawing Sheets

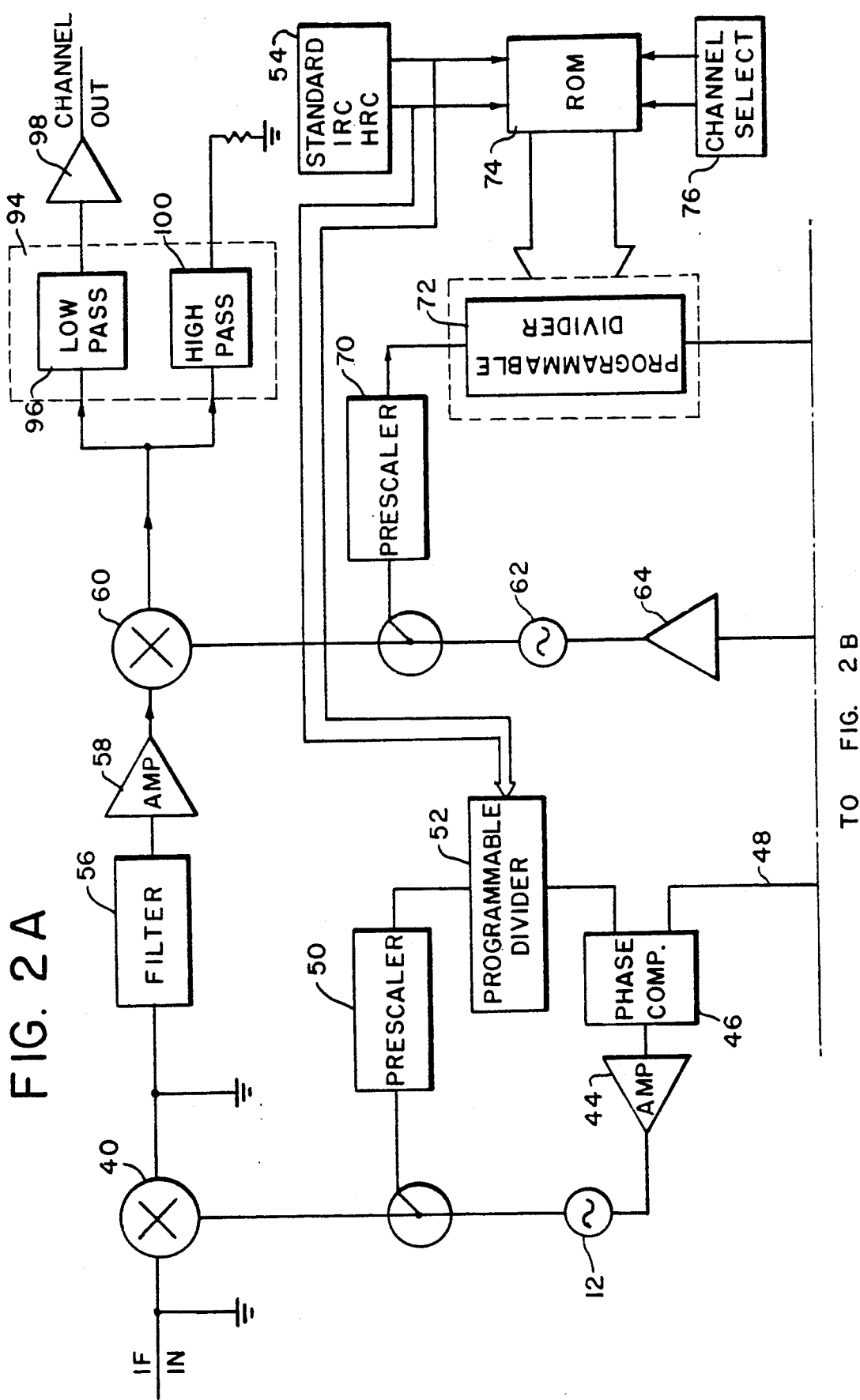

LOW PHASE NOISE AGILE UP CONVERTER

The present invention relates to an up converter for use in the head end of a cable TV distribution system and more particularly to an agile up converter with low phase noise.

At the headend of a cable TV distribution system video programs are applied to selected channel frequencies and distributed to a plurality of receivers. This is accomplished by a video modulator which increases the frequency of the video signal to an intermediate frequency (IF) signal and an up converter which converts the IF signal into a signal with the appropriate channel frequency. The frequency may be any one of the eighty six channels currently available per cable.

In preparing programs for distribution, the system operator must be mindful of Federal Communications Commissions specifications with respect to frequency accuracy. In addition, the FCC specifies three different broadcast conventions which can be employed: standard, IRC and HRC. Each convention designates a different frequency for each of the available channels.

Up converters which are programmable such that they can be utilized to generate signals on any selected channel using any one of the three broadcast frequency conventions, are known as "agile". Most conventional cable TV agile up converters use a two stage IF conversion. The first stage of the conversion brings the incoming IF signal to a high frequency IF. The second stage converts the high frequency IF to the channel frequency.

Each of the stages includes a mixer which receives an oscillator signal. The oscillator is in a phase locked loop. The oscillator is regulated in accordance with a phase comparision between a sampling of the oscillator output and a reference.

In the conventional up converter, the oscillator in the second stage has a wide frequency range (from 770 MHz to 1800 MHz). The input control voltage range is in the order of ten to fifty volts. Accordingly, the gain of the oscillator in the second stage is very high and hence so will be its phase noise. This is because it is almost impossible to eliminate noise in the control line and the control line noise tends to frequency modulate the oscillator.

Although the oscillator is part of the phase locked loop which is suppose to reduce the phase noise because the reference frequency is a "clean reference", in practice due to the need to comply with FCC regulations regarding all three broadcast frequency conventions, the reference frequency for the phase locked loop of the second stage has to be very low, in the order of hundreds of hertz. At this reference frequency, the loop cannot compensate for noise kilohertz away from the carrier.

In general, the present invention reduces the phase noise in an agile up converter by, among other things, tying the phase references for both stages to the same master reference to ensure frequency locking, by offsetting the frequency of the oscillator in the first stage to accommodate each of the three FCC broadcast frequency conventions and by generating a local oscillator signal for a video modulator which is also phase locked to the master reference.

It is, therefore, a prime object of the present invention to provide an agile up converter having reduced phase noise.

It is another object of the present invention to provide a low phase noise agile up converter in which the oscillator for each stage is phase locked to a common master reference.

It is another object of the present invention to provide a low phase noise agile up converter wherein the oscillator frequency for the first stage is offset in accordance with a selected one of three different FCC broadcast frequency conventions.

It is another object of the present invention to provide a low phase noise agile up converter which has the capability of generating a local oscillator output to the video modulator which is also phase locked to the master reference.

In accordance with one aspect of the present invention, a cable TV up converter is provided comprising means for a selecting a channel frequency and means for selecting a broadcast frequency convention. A phase locked loop is provided including a signal controlled oscillator for generating an oscillator frequency. Means are provided for mixing the oscillator frequency with the input signal to form a mixed signal. Means are provided for controlling the oscillator to oscillate at a selected one of several levels in accordance with the selected frequency convention, each of the levels corresponding to a different one of the frequency conventions.

The oscillator control means comprises a divider controlled in response to the output of the frequency convention selecting means. Phase comparison means are operatively connected to compare the phase of the output of the divider and the phase of a first reference signal and to control the oscillator in accordance therewith.

A second phase locked loop is provided, including a second signal control oscillator for generating a second oscillator frequency. Means are provided for mixing the second oscillator and the mixed signal to form a channel frequency output. Means are provided for controlling the second oscillator in accordance with the selected frequency convention and the selected channel.

The second oscillator control means comprises a programmable divider. The converter also includes a second phase comparison means operatively connected to compare the phase of the output of the programmable divider and a phase of second reference signal and to control the second oscillator in accordance therewith.

The phase of the first reference is matched to the same as the phase of the second reference. Preferably, the first reference and the second reference are derived from the same master reference.

Means are provided for generating the second reference. Preferably, the reference generating means generates a relatively high frequency. Most preferably, the second reference is in the order of tens of megahertz.

One of the levels causes the oscillator frequency of the first stage to shift 12.5 KHz (or multiples thereof) and a second level causes the oscillator frequency to shift 1250 KHz from the standard broadcast frequency convention for a selected channel frequency.

The up converter is design for use with an external video frequency to IF frequency modulator of the type which utilizes a local oscillator signal. The converter comprises means for generating a local oscillator signal for the modulator which has the same phase as the master reference. In this way, all three modulator stages are phase locked to a single reference.

In accordance with another aspect of the present invention, a cable TV up converter is provided comprises first and second mixer stages. Each of the modulator stages includes an oscillator controlled by a reference signal in a phase locked loop. The reference signals which control the oscillators in the different modulator stages are phase matched.

The modulator further comprises means for deriving both reference signals from the same master reference. In this way, frequency locking is assured.

The converter is designed for use with an external video modulator requiring a local oscillator signal. The converter comprises means for generating the local oscillator signal for the external video modulator with the same phase as the reference signals used internally. Preferably, this local oscillator signal is derived from the master reference.

The converter also includes means for generating a relatively high frequency (in the order of tens of megahertz) reference signal to the oscillator of the second modulator stage. It also includes means for offsetting the oscillator freqency of the first modulator stage.

Figure 2B:
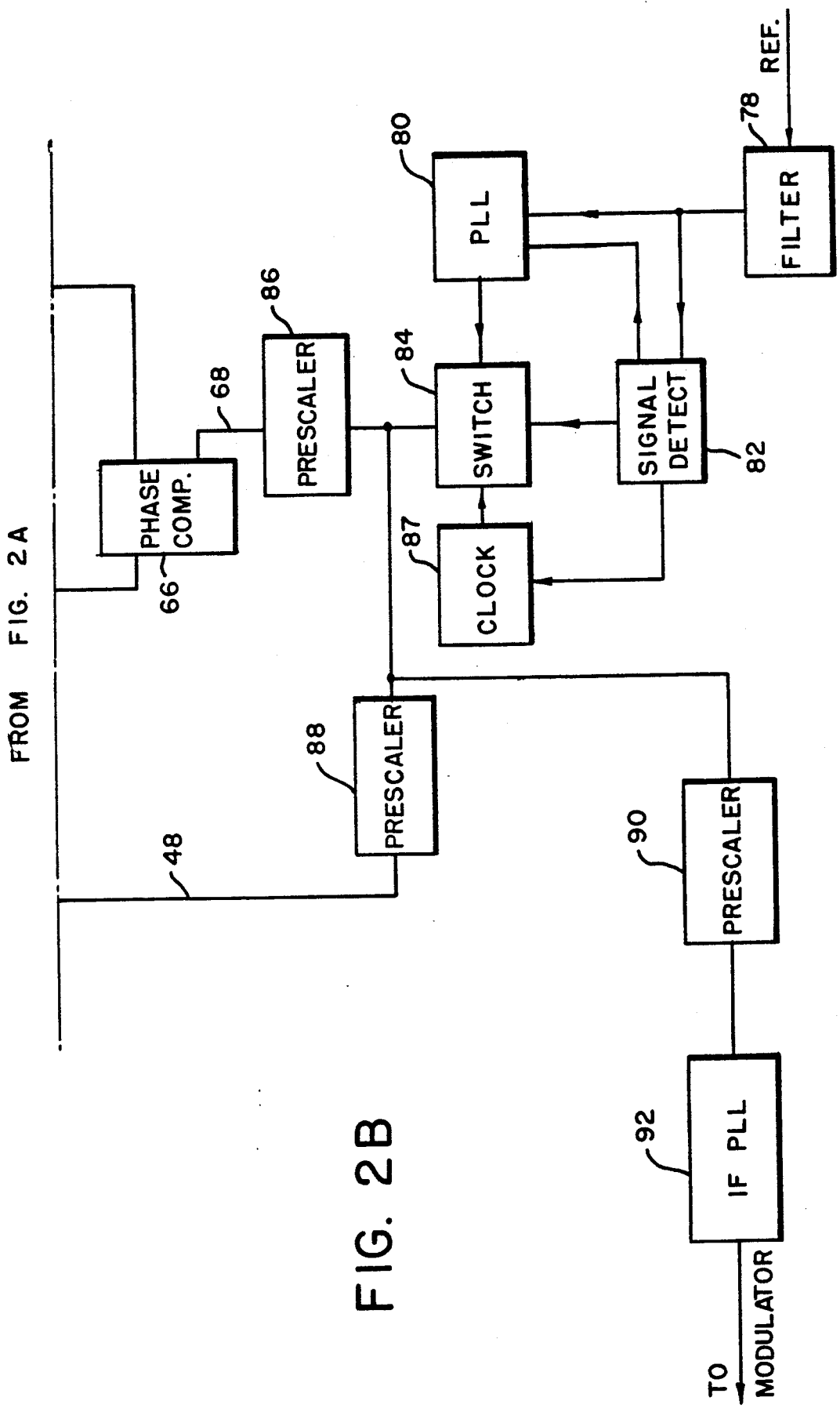

To these and such other objects which may hereinafter appear, the present invention relates to a low phase noise agile up converter as described in the following specification and recited in the annexed claims, taken together with the accompanying drawings, wherein like numerals refer to like parts and in which:

FIG. 1 is a schematic diagram of a prior art agile up converter;

FIGS. 2A and 2B together form a schematic diagram of the low phase noise agile up converter of the present invention.

FIG. 1 schematically shows a conventional agile up converter. The output of a video modulator provides the IF input to a mixer 10. The other input mixer 10 is connected to the output of a first voltage controlled local oscillator 12. Oscillator 12 is controlled by the output of a filter and amplifier 14 which in turn is connected to the output of a phase comparator 16. Phase comparator 16 compares the phase of a sampling of a output of oscillator 12 with the phase of a reference 1 and adjusts the input voltage to the oscillator accordingly. The sampling is provided through the feedback loop including a prescaler 18 and a divider 20 which complete the phase locked loop.

The second stage of the converter is essentially identical to the first stage and consists of a mixer 20 which mixes the high frequency IF output of filter 24, which is connected to the output of mixer 10. A second local oscillator signal is generated by a second voltage control oscillator 26. The voltage control for oscillator 26 is provided by a filter and amplifier 28 which in turn is controlled by the output of a second phase comparator 30. Phase comparator 30 compares the phase of a sampling of the output of oscillator 26 with the phase of reference 2 and regulates the voltage input to oscillator 26 accordingly. A prescaler 32 and divider 34 provide the feedback input to phase comparator 30 and complete the phase locked loop. The output of mixer 22 is amplified in amplifier 36.

Oscillator 26 has a relatively wide frequency range (between 770 MHz and 1800 MHz). The control voltage of oscillator 26, the output of amplifier 28, is normally within the range in the order of 10 to 50 volts. Accordingly, the gain of oscillator 26 is very high, as is its phase noise.

Unfortunately, it is almost impossible to eliminate the noise in the control line. Hence, this noise will frequency modulate oscillator 26. Oscillator 26 is part of the phase locked loop which is suppose to reduce the phase noise because the reference frequency is a "clean reference". However, due to the need to comply with the FCC broadcast frequency conventions to permit broadcast on the IRC, standard and HRC modes, reference 2 which controls the phase locked loop of the second stage has to be very low, in the order of hundreds of hertz. As a result, this phase locked loop cannot compensate for noise kilohertz away from the carrier. The present invention overcomes this difficulty and substantially reduces the phase noise of the up converter.

As illustrated in FIGS. 2A and 2B, the up converter of the present invention includes a first mixer 40 which receives the IF input and the output of the first voltage controlled oscillator 42 situated within the phase locked loop of the first modulator stage. Oscillator 42 is preferably a saw resonator voltage controlled oscillator which is inherently a low phase noise oscillator and which can be offset as explained below.

The voltage control signal for oscillator 42 is provided by a filter and amplifier 44 which in turn is connected to the output of a phase comparator 46. comparator 46 compares the phase of a sample of the output of oscillator 42 and a reference signal on line 48 and adjusts the local oscillator frequency accordingly. The feedback input of comparator 46 is obtained from a prescaler 50 and a programmable divider 52. Prescaler 50 is preferably a divide by 8 prescaler. Programmable divider 52 is controlled by the output of a broadcast frequency convention selection circuit 54 which receives information concerning the particular FCC broadcast frequency convention which has been selected (Standard, IRC or HRC). Depending upon which of the three conventions is selected, the programmable divider will be approximately programmed.

When the Standard convention is selected, the oscillator 42 will normally generate a signal at 674 MHz. However, if the IRC convention is selected, the oscillator signal will be offset by 12.5 KHz. Similarly, if the HRC convention is selected, the oscillator signal will be offset by 1250 KHz.

The output of mixer 40 passes through a 720 MHz filter 56 and an amplifier 58. The oputput of amplifier 58 is the high frequency IF input to mixer 60. The other input to mixer 60 is the output of a second voltage controllable oscillator 62. The voltage control for oscillator 62 is provided by the output of filter and amplifier 64 which in turn is regulated by the input of a second phase comparator 66. Comparator 66 compares the phase of a sampling of the output of oscillator 62 with the phase of a reference signal which appears on line 68 and regulates the local oscillator frequency accordingly. The feedback input to comparator 66 is provided through a prescaler 70, preferably a divide by 8 prescaler, and a programmable divider 72. Programmable divider 72, is programmed in accordance with the output of a ROM (read only memory) 74 which receives the input from the broadcast frequency convention selector circuit 54 and a channel select circuit 76.

Because the frequency of oscillator 42 is offset in accordance with the selected broadcast frequency convention, the frequency of oscillator 62 will be in round numbers allowing steps of 1 MHz. These relatively large steps allow the use of a relatively high frequency reference on line 68. Preferably, this reference is in the order of tens of kilohertz. Consequently, the phase locked loop of the second stage will be able to compensate for noise kilohertz away from the selected carrier.

It is noted that each of the programmable dividers 52 and 72 are used in conjunction with prescaler 50, 70. This is because at the present stage of technology, dividers of the type employed herein which are available at a reasonable price are limited in frequency. Accordingly, the sampled oscillator frequency is first divided by a prescaler. The high frequency output step of the oscillator divided by the prescaler factor (in this instance 8) is the response frequency of the phase locked loop. Accordingly, it is important to have a large step and a low prescaler factor to minimize the reference frequency and reduce the phase noise.

The references on line 48 and 68 are phase matched because they are both derived from a single same master reference. The master reference, preferably 48 MHz, is normally externally supplied at the input of a filter 78, the output of which is connected to a phase locked loop 80 and a signal detect circuit 82. As long as the output of filter 78 is protected (that is, the external master reference is supplied), circuit 82 will keep the phase locked loop 80 operative such that the reference will be applied, through switch 84, to the input of prescaler 86, which preferably divide by 16 prescaler.

However, if signal detector circuit 82 does not detect the signal output of filter 78, it automatically turns on an internal 2 MHz clocked 88 which is then switched by switch 84 to provide the input to prescaler 86 which provides the relatively high frequency reference for the second stage. The output of switch 84 is also converted to the input to another scaler 88, preferably a divider 1280 prescaler, which supplies the relatively low frequency reference signal on line 48 to the loop of the first stage. In this manner, even if for some reason the external master reference is interrupted. The appropriate reference frequencies are supplied such that the converter continues to function.

The up converter of the present invention is designed for use in conjunction with a video modulator which changes video signals into IF. A video modulator of this type utilizes a local oscillator signal. The present converter generates a local oscillator signal for use by the modulator through the use of a prescaler 90, preferably a divider by 8 prescaler and IF phase locked loop 92 which generates a 45.75 MHz local oscillator signal which is phase matched to the master reference. Hence, the local oscillator signals for the video monitor and the two stages of the up converter are all phase matched because they are based on a single master reference.

The output of mixer 60 is filtered in an output filter 94 which includes a low pass filter 96 connected to the output amplifier 98 and high pass filter 100 the output of which is grounded.

It should now be appreciated that the present invention relates to a low phase noise agile up converter which reduces phase noise by using phase matched reference signals in each stage, by offsetting the oscillator signal in the first stage in accordance with the broadcast frequency convention selected, which utilizes a high frequency reference in the second stage to reduce phase noise and which provides a local oscillator signal for use with an external video modulator which is also phase matched because it is based on the same master reference as the converter stages.

While only a single embodiment of the present invention has been disclosed for purposes of illllustration, it is obvious that many variations and modifications could be made thereto. It is intended to cover all of these variations and modifications which fall within of the scope of the present invention, as defined by the following claims:

I claim:

1. A cable TV up converter for converting a composite video IF signal into a composite video RF signal comprising means for selecting a channel, means for selecting a broadcast frequency convention, phase locked loop means comprising signal controlled oscillator means for generating an oscillator frequency, means for mixing said oscillator frequency and the IF signal to form a mixed signal, means operably connected to said broadcast convention selecting means for controlling said oscillator means to generate a given oscillator frequency when the Standard broadcast frequency convention is selected and for shifting said given oscillator frequency by multiples of 12.5 kHz when the IRC broadcast frequency convention is selected, and by 1250 kHz, when the HRC broadcast frequency convention is selected and means, operably connected to said channel selecting means, for converting said mixed signal into the appropriate composite video RF signal for the selected channel.

2. The converter of claim 1 wherein said oscillator control means comprises a divider controllable in response to the output of said broadcast frequency convention selecting means.

3. The converter of claim 2 further comprising phase comparison means operatively connected to compare the phase of the output of said divider and the phase of a first reference signal and to control said oscillator in accordance therewith.

4. The converter of claim 3 further comprising a second phase locked loop, including a second signal controlled oscillator for generating a second oscillator frequency, means for mixing said second oscillator frequency and said mixed signal to form the channel frequency output and means for controlling said second oscillator in accordance with the selected broadcast frequency convention and the selected channel.

5. The converter of claim 4 wherein said second oscillator control means comprises a programmable divider.

6. The converter of claim 4 further comprising second phase comparision means operatively connected to compare the phase of the output of said programmable divider and the phase of a second reference signal and to control said second oscillator in accordance therewith.

7. The converter of claim 6 comprising means for matching the phase of said first reference and the phase of said second reference.

8. The converter of claim 7 comprising means for deriving said first reference and said second reference from the same master reference.

9. The converter of claim 6 further comprising means for generating said second reference signal to be a relatively high frequency signal, in the order of tens of megahertz.

10. The converter of claim 8 for use with an external video modulator which utilizes a local oscillator signal wherein said converter comprises means for generating said local oscillator signal for said modulator with a phase which matches the phase of said first and said second references.

11. A cable TV up converter for use with an external video modulator generating an IF signal based on the output of a signal controlled local oscillator therein, said converter comprising first and second operably connected signal modulator stages, for converting the IF signal to a composite video RF signal, each of said modulator stages comprising a phase locked loop, including signal controlled oscillator means having an output signal the phase of which is a function of the phase of a reference signal, means for generating a phase matched reference signal for each of said modulator stages and means for generating an external reference signal for the local oscillator of the video modulator, said external refernce signal having a phase which is matched to the phase of said reference signals.

12. The converter of claim 11 comprising means for deriving both of said reference signals from the same master reference.

13. The converter of claim 12 further comprising means for deriving said local oscillator signal from said master reference.

14. The converter of claim 11 comprising means for offsetting the oscillator frequency of the first modulator stage.

15. The converter of claim 11 comprising means for generating a relatively high frequency reference signal, in the order of tens of megahertz, for the second modulator stage.

16. The converter of claim 14 comprising means for generating a relatively high frequency reference signal, in the order of tens of megahertz, for the second modulator stage.

* * * * *